United States Patent [19]

Nagai et al.

[11] Patent Number: 4,983,838
[45] Date of Patent: Jan. 8, 1991

[54] PYROELECTRIC ELEMENT

[75] Inventors: Aisaku Nagai, Iwaki; Norikazu Murata, Tokyo, both of Japan

[73] Assignee: Kureha Kagaku Kogyo Kabushiki Kaisha, Tokyo, Japan

[21] Appl. No.: 335,419

[22] Filed: Apr. 10, 1989

[30] Foreign Application Priority Data

Apr. 13, 1988 [JP] Japan ............................ 63-49681[U]

[51] Int. Cl.$^5$ ............................................. G01J 5/14
[52] U.S. Cl. ................................. 250/338.3; 250/349
[58] Field of Search ............................ 250/338.3, 349

[56] References Cited

U.S. PATENT DOCUMENTS 3,839,640 10/1974 Rossin .............................. 250/353
4,556,796 12/1985 Renals ........................... 250/338.3

FOREIGN PATENT DOCUMENTS 0131996 1/1985 European Pat. Off. .
32337 8/1983 Japan .
175583 6/1986 Japan .

Primary Examiner—Carolyn E. Fields
Attorney, Agent, or Firm—Armstrong, Nikaido, Marmelstein, Kubovcik, & Murray

[57] ABSTRACT

A pyroelectric element includes a plurality of electrodes formed on one major surface of a pyroelectric film and constituting a first group and at least one electrode formed on the other major surface of the pyroelectric film and constituting a second group, wherein directions of proximal end portions of lead portions of the electrodes and widths of the proximal end portions are set to be a predetermined direction and a predetermined value such that effective light-receiving electrode areas of unit pyroelectric elements are substantially equal to each other even if electrode patterns of the first and second groups are slightly offset from each other. Provided is a pyroelectric element having excellent electrical characteristics against disturbing external light.

12 Claims, 3 Drawing Sheets

PYROELECTRIC ELEMENT

BACKGROUND OF THE INVENTION

1. Field of the Invention

The present invention relates to a pyroelectric element having a plurality of unit pyroelectric elements obtained by forming a plurality of electrodes on one major surface of a pyroelectric film and forming at least one electrode on the other major surface and, more particularly, to an electrode structure of such an element. The pyroelectric element is suitably used for a pyroelectric infrared sensor.

2. Description of the Prior Art

High reliability is required for intrusion detection pyroelectric infrared sensors used in the fields of securities and automatic doors. Various extensive studies and developments have been made to satisfy the above requirement. U.S. Pat. No. 3,839,640 discloses a pyroelectric infrared sensor wherein a pair of unit pyroelectric elements are connected in parallel or series with each other so as to have opposite polarities, thereby constituting a dual pyroelectric element and improving defects of generating detection errors caused by changes in room temperature and incidence of disturbing external light. Japanese Pat. Laid-Open (Kokai) No. 61-175583 and Japanese Utility Model Laid-Open (Kokai) No. 58-32337 and European Pat. Provisional Publication No. 131,996 disclose electrode structures of dual pyroelectric elements described above, as shown in FIGS. 1A, 2A and 3A, respectively.

The electrode structures of dual pyroelectric elements shown in FIGS. 1A, 2A and 3A will be described below. The same reference numerals denote the same parts throughout FIGS. 1A, 2A and 3A.

Referring to each of FIGS. 1A, 2A and 3A, reference numeral 1 denotes a pyroelectric film; and 2 and 3, light-transmissive or light-absorptive electrodes (to be referred to as light-receiving electrodes hereinafter). The light-receiving electrodes 2 and 3 comprise electrode bodies 2a and 3a and lead portions 2b and 3b extending from the electrode bodies 2a and 3a, respectively. Reference numerals 4 and 5 denote lower electrodes formed on the lower surface of the pyroelectric film 1. The electrodes 4 and 5 comprise electrode bodies 4a and 5a for defining effective light-receiving electrode surfaces and lead portions 4b and 5b extending from the electrode bodies 4a and 5a, respectively. The light-receiving electrodes 2 and 3 are point-symmetrically formed on the upper surface of the pyroelectric film 1. The lower electrodes 4 and 5 are point-symmetrically formed on the lower surface of the pyroelectric film 1. The light-receiving electrodes 2 and 3 and the lower electrodes 4 and 5 are arranged on the upper and lower surfaces of the pyroelectric film 1 to constitute identical electrode patterns.

The light-receiving electrode 2, the lower electrode 4, and a portion of the pyroelectric film which is sandwiched between the electrodes 2 and 4 constitute a first unit pyroelectric element. The light-receiving electrode 3, the lower electrode 5, and a portion of the pyroelectric film 1 which is sandwiched between the electrodes 3 and 5 constitute a second unit pyroelectric element. The first and second unit pyroelectric elements are connected in series or parallel with each other so as to have opposite polarities, thereby constituting a dual pyroelectric element. For example, in order to connect the first and second unit pyroelectric elements in parallel with each other so as to have opposite polarities, a distal end portion 6 of the lead portion 2b is electrically connected to a distal end portion 6 of the lead portion 5b by a conductive adhesive such as a solder, a low melting solder or a conductive paint, or by a U-shaped conductive clip. Input terminals of FETs (Field Effect Transistors-not shown) and lead wires (not shown) are also connected as needed. A distal end portion 6 of the lead portion 3b and a distal end portion 6 of the lead portion 4b are electrically connected to each other in the same manner as in connections of the distal end portions 6 of the lead portions 2b and 5b.

As described above, although various extensive studies and developments have been made on dual pyroelectric elements obtained by pairing unit pyroelectric elements, pyroelectric infrared sensors having excellent electrical characteristics against disturbing external light cannot always be manufactured by using the conventional techniques of dual pyroelectric elements. In addition, variations in electrical characteristics against disturbing external light are found between the manufacturing lots.

SUMMARY OF THE INVENTION

It is, therefore, an object of the present invention to provide a pyroelectric element having excellent electrical characteristics against disturbing external light and obtained by combining a plurality of unit pyroelectric elements.

The above and other objects, features, and advantages of the present invention will be readily understood by the following detailed description in conjunction with the accompanying drawings.

DETAILED DESCRIPTION OF THE PREFERRED EMBODIMENTS

In a dual pyroelectric element obtained by connecting first and second unit pyroelectric elements in series or parallel with each other so as to have opposite polarities, in order to prevent a detection error caused by disturbing external light, electrical characteristics of the first and second unit pyroelectric elements against disturbing external light must be substantially identical. More specifically, when the first and second unit pyroelectric elements are connected in parallel with each other so as to have opposite polarities, generating charge of the first unit pyroelectric element must be substantially equal to that of the second unit pyroelectric element upon simultaneous incidence of infrared rays thereon. When the first and second unit pyroelectric elements are connected in series with each other so as to have opposite polarities, a generating potential of the first unit pyroelectric element must be substantially equal to that of the second unit pyroelectric element upon simultaneous incidence of infrared rays thereon.

However, even if variations in thicknesses, dielectric constants, and pyroelectric coefficients of unit pyroelectric elements which are actually manufactured were reduced, their electrical characteristics against disturbing external light could not be improved.

The present inventors made extensive research and studies on the cause of the above problem. They found that the light-receiving electrode pattern formed on the upper surface of the pyroelectric film was positionally offset from the lower electrode pattern formed on the lower surface of the pyroelectric film, and the effective light-receiving electrode areas were different from each other between the unit pyroelectric elements. This phenomenon in pyroelectric elements having conventional electrode structures will be described with reference to FIGS. 1A to 3B.

Figure 1A:
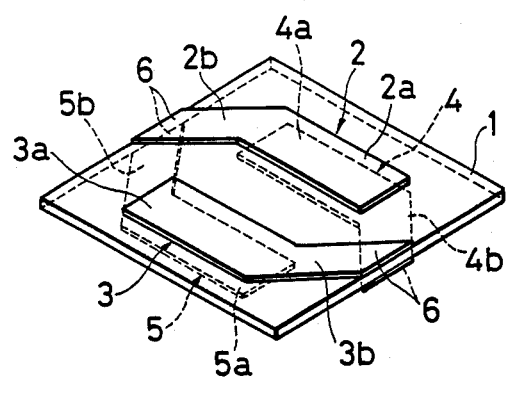
FIG. 1A is a perspective view showing a conventional pyroelectric element.
Figure 1B:
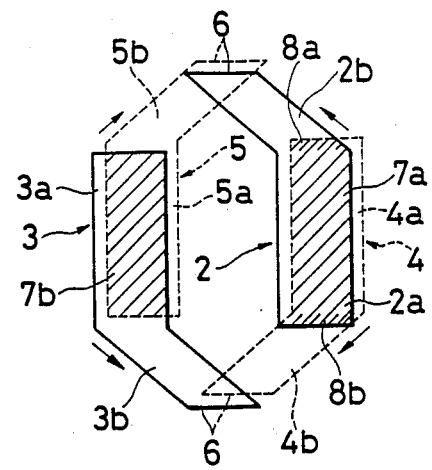
FIG. 1B is a plan view showing the pyroelectric element shown in FIG. 1A in which light-receiving electrodes and lower electrodes are offset from each other.
Figure 2A:
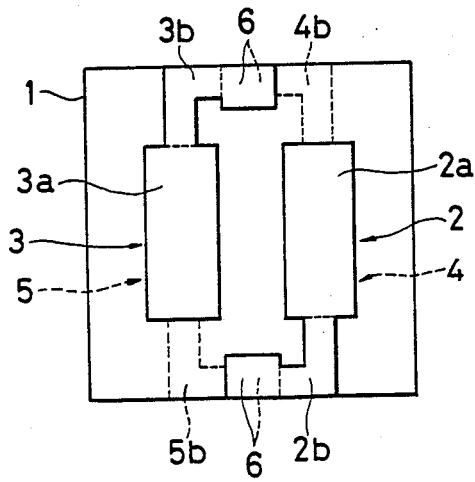
FIG. 2A is a plan view showing another conventional pyroelectric element.
Figure 2B:
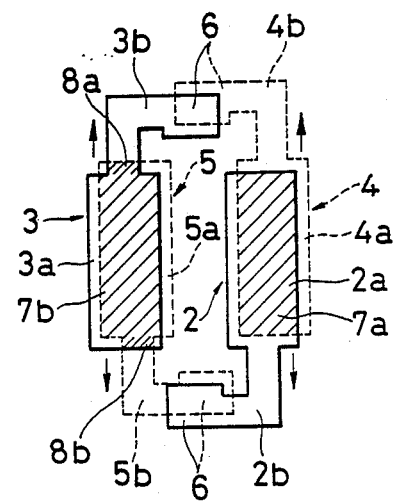
FIG. 2B is a plan view showing the pyroelectric element shown in FIG. 2A in which light-receiving electrodes and lower electrodes are offset from each other.
Figure 3A:
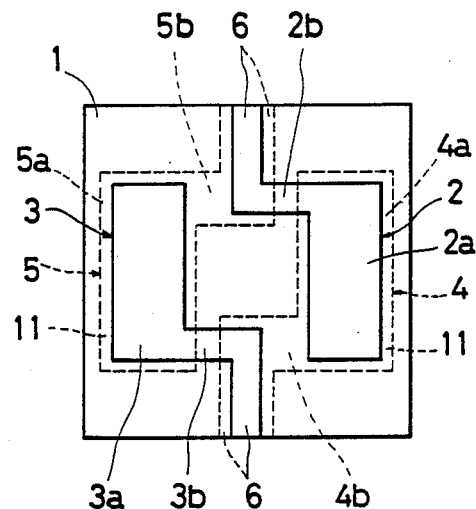
FIG. 3A is a plan view, showing still another conventional pyroelectric element.
Figure 3B:
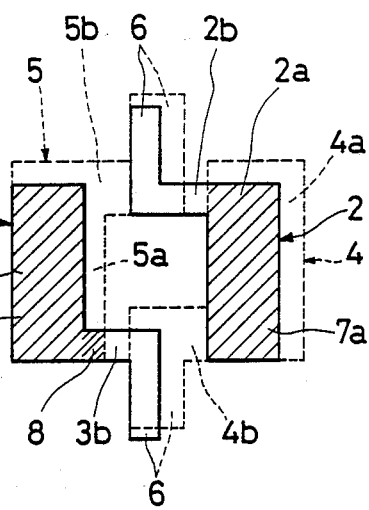
FIG. 3B is a plan view showing the pyroelectric element shown in FIG. 3A in which light-receiving electrodes and lower electrodes are offset from each other.

Offsets in the right-and-left direction between the electrodes 2 and 3 formed on the upper surface of the pyroelectric film 1 and the electrodes 4 and 5 formed on the lower surface of the pyroelectric film 1 of each of the pyroelectric elements shown in FIGS 1A, 2A and 3A are illustrated in FIGS. 1B, 2B and 3B, respectively. The pyroelectric films 1 are not illustrated in FIGS. 1B, 2B and 3B. In each of FIGS. 1B, 2B and 3B, hatched portions 7a and 7b represent overlapping portions between the electrodes 2 and 4 and between the electrodes 3 and 5. Arrows indicate directions along which the lead portions 2b, 3b, 4b and 5b extend from the electrode bodies 2a, 3a, 4a and 5a.

In the pyroelectric element of FIG. 1B, the right hatched portion 7a of the pair of hatched portions 7a and 7b is larger than the left hatched portion 7b by upper and lower double hatched end portions 8a and 8b. In the pyroelectric element of FIG. 2B, the left hatched portion 7b is larger than the right hatched portion 7a by upper and lower double hatched end portions 8a and 8b. In the pyroelectric element of FIG. 3B, the left hatched portion 7b is larger than the right hatched portion 7a by a double hatched portion 8 at a proximal end portion of the lead portion 3b of the electrode 3. The double hatched portions 8a, 8b and 8 represent overlapping portions of the lead portions 2b to 5b on any of the electrodes 2 to 5 located on the opposite side through the pyroelectric film 1. It is apparent that the double hatched portions 8a, 8b and 8 cause a difference between the effective light-receiving electrode areas of the first and second unit pyroelectric elements.

As described above, the double hatched portions 8a, 8b and 8 are formed since the directions (i.e., a lead start direction) along which the lead portions 2b to 5b extend from the electrode bodies 2a to 5a are different from each other. When the patterns of the electrode 2 to 5 are offset on the upper and lower surfaces of the pyroelectric film 1 in the vertical direction and/or right-and-left direction, a state of offset between the electrodes 2 and 4 is different from a state of offset between the electrodes 3 and 5.

In order to solve the above problem, the electrodes 2 and 3 on the upper surface of the pyroelectric film 1 are made smaller than the electrodes 4 and 5 on the lower surface to allow only a slight offset between the upper and lower electrode patterns, as shown in FIG. 3A. However, even when this design concept is employed, the effective light-receiving electrode areas of the first and second unit pyroelectric elements are different from each other, as shown in FIG. 3B, due to the reasons described above.

Figure 4A:
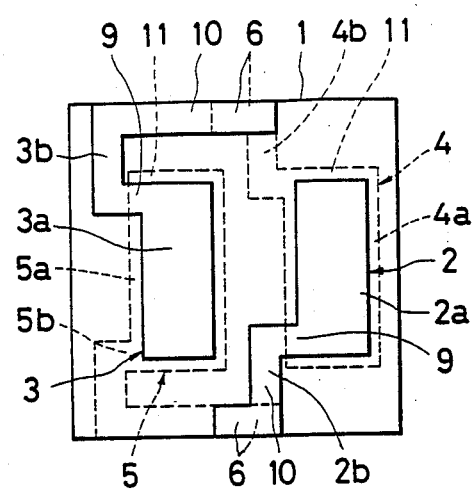
FIG. 4A is a plan view showing a pyroelectric element according to an embodiment of the present invention.
Figure 4B:
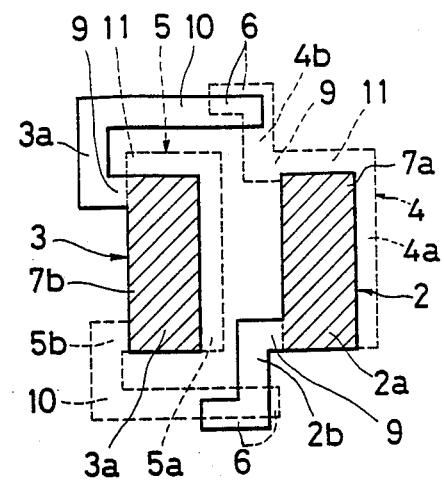
FIG. 4B is a plan view showing the pyroelectric element shown in FIG. 4A in which light-receiving electrodes and lower electrodes are offset from each other.
Figure 5A:
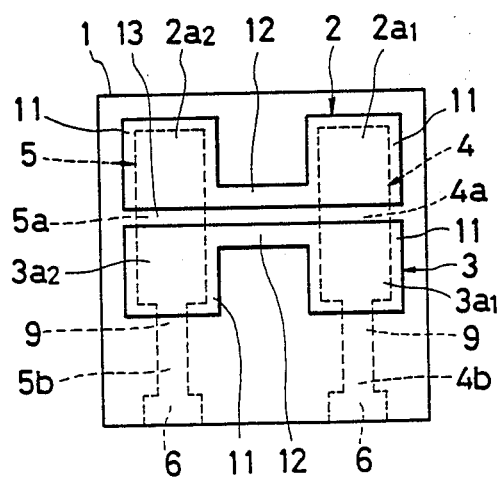
FIG. 5A is a plan view showing a pyroelectric element according to another embodiment of the present invention.

FIGS. 4A and 5A show pyroelectric elements of first and second embodiments of the present invention on the basis of the above findings. These elements have unique electrode structures. The same reference numerals as in FIGS. 1A to 3B denote the same parts in FIGS. 4A to 5B.

Referring to FIG. 4A, reference numeral 1 denotes a pyroelectric film consisting of a polymeric ferroelectric substance such as PVDF (polyvinylidene fluoride) and a copolymer of VDF (vinylidene fluoride) with another monomer and has a length of 10 mm, a width of 10 mm, and a thickness of 0.005 to 0.100 mm. Light-transmissive or light-absorptive electrodes (to be referred to as light-receiving electrodes hereinafter) 2 and 3 each having a thickness of 0.001 to 0.02 μm and consisting of a metal such as Ni, Cr or NiCr are formed on the upper surface of the pyroelectric film 1. Lower electrodes 4 and 5 each having a thickness of 0.005 to 0.10 μm and consisting of a metal such as Al, Au, Ag, Pt or Ni are formed on the lower surface of the pyroelectric film 1.

The electrodes 2 to 5 comprise substantially rectangular electrode bodies 2a to 5a for substantially defining effective light-receiving electrode areas and narrow lead portions 2b to 5b extending from the electrode bodies 2a to 5a, respectively. The width of each of the lead portions 2b to 5b is preferably smaller than that of each of the electrode bodies 2a to 5a. The electrode bodies 2a and 3a of the electrodes 2 and 3 have substantially the same shape. The electrode bodies 4a and 5a of the electrodes 4 and 5 have substantially the same shape. However, the electrode bodies 4a and 5a are formed to have extended portions 11 around the entire edges of the electrode bodies 2a and 3a if no positional offsets (positional errors) occur between the electrode bodies 4a and 5a and the electrode bodies 2a and 3a, as shown in FIG. 4A. The width of each extended portion 11 may be about 5 to 30% of the width of each of the electrode bodies 2a to 5a.

The directions along which the lead portions 2b to 5b start extending from the electrode bodies 2a to 5a are substantially the same, and the widths of proximal end portions 9 of the lead portions 2b to 5b are substantially equal to each other. The "same direction" herein includes cases wherein a direction of one lead portion is parallel to a direction of another lead portion, and a direction of one lead portion is aligned with a direction of another lead portion with the same orientation.

Each of the lead portions 2b to 5b comprises a short proximal end portion 9 extending in the same direction and an L-shaped portion 10 extending from the proximal end portion 9 in a direction substantially perpendicular to the same direction. The proximal end portions 9 are formed so as not to overlap each other. The distal end portions 6 of the L-shaped portions 10 of the electrodes 2 and 5 oppose each other on the upper and lower surfaces through the pyroelectric film 1 at its edge. At the same time, the distal end portions 6 of the L-shaped portions 10 of the electrodes 3 and 4 oppose each other on the upper and lower surfaces of the pyroelectric film 1 in the same manner as described above.

The upper patterns of the electrodes 2 and 3 are almost symmetrical with the lower patterns of the electrodes 4 and 5 except for the presence of the extended portions 11.

The light-receiving electrode 2, the lower electrode 4, and a portion of the pyroelectric film 1 which is sandwiched between the electrodes 2 and 4 constitute a first unit pyroelectric element. The light-receiving electrode 3, the lower electrode 5, and a portion of the pyroelectric film 1 which is sandwiched between the electrodes 3 and 5 constitute a second unit pyroelectric element. The first and second unit pyroelectric elements are connected in parallel with each other so as to have opposite polarities, thereby constituting a dual pyroelectric element. As disclosed in Japanese Pat. Laid-Open (Kokai) No. 61-175583 and European Pat. Provisional Publication No. 131,996, when the first and second unit pyroelectric elements are connected in parallel with each other so as to have opposite polarities, the distal end portion 6 of the lead portion 2b and the distal end portion 6 of the lead portion 5b are electrically connected by a conductive adhesive such as a solder, a low melting solder and a conductive paint, or by a U-shaped conductive clip. During this connection, input terminals of FETs (not shown) and lead wires (not shown) may also be connected as needed. The distal end portion 6 of the lead portion 3b and the distal end portion 6 of the lead portion 4b are electrically connected to each other in the same manner as in connections of the distal end portions 6 of the lead portions 2b and 5b.

FIG. 4B shows a state wherein the patterns of the light-receiving electrodes 2 and 3 of the pyroelectric element shown in FIG. 4A are shifted from the patterns of the lower electrodes 4 and 5 by a width of the extended portion 11 in the vertical direction and the right-and-left direction. This positional offset often occurs due to manufacturing errors during formation of the electrodes 2 to 5 on the pyroelectric film 1.

Referring to FIG. 4B, since the proximal end portions 9 of the lead portions 2b to 5b of the electrodes 2 to 5 extend in the same direction, a state of a positional offset between the electrodes 2 and 4 including the lead portions 2b and 4b is similar to that between the electrodes 3 and 5 including the lead portions 3b and 5b. For this reason, the effective light-receiving electrode areas of the first and second unit pyroelectric elements are substantially equal to each other, as indicated by the hatched portions 7a and 7b in FIG. 4B.

FIG. 5A shows another arrangement of the pyroelectric element in which first and second unit pyroelectric elements are connected in series with each other so as to have opposite polarities. The pyroelectric element shown in FIG. 5A is substantially the same as that of FIG. 4A except for differences in shapes of the electrodes 2 to 5.

Referring to FIG. 5A, lower electrodes 4 and 5 are formed on the lower surface of a pyroelectric film 1. The lower electrodes 4 and 5 comprise parallel electrode bodies 4a and 5a and narrow lead portions 4b and 5b extending from the electrode bodies 4a and 5a to the edge of the pyroelectric film 1 in the same extension direction of the electrode bodies 4a and 5a. The width of each of the lead portions 4b and 5b may be the same as that shown in FIG. 4A. Distal end portions 6 of the lead portions 4b and 5b are electrically connected to lead wires and input terminals of FETs as needed in the same manner as in FIG. 4A.

Light-receiving electrodes 2 and 3 are formed on the upper surface of the pyroelectric film 1. The electrode 2 comprises electrode bodies $2a_1$ and $2a_2$ overlapping first-direction halves of the electrode bodies 4a and 5a of the electrodes 4 and 5 and a narrow connecting portion 12 for connecting the electrode bodies $2a_1$ and $2a_2$. The electrode 3 comprises electrode bodies $3a_1$ and $3a_2$ overlapping remaining halves (in a direction opposite to the first direction) of the electrode bodies 4a and 5a of the electrodes 4 and 5, and a narrow connecting portion 12 for connecting the electrode bodies $3a_1$ and $3a_2$. A narrow gap 13 is formed between the light-receiving electrodes 2 and 3. The gap 13 is about 5 to 30% of the width of each of the electrodes 2a to 5a.

When no offset occurs between the electrode bodies $2a_1$, $2a_2$, $3a_1$ and $3a_2$ and electrode bodies 4a and 5a, as shown in FIG. 5A, the electrode bodies $2a_1$, $2a_2$, $3a_1$ and $3a_2$ are formed to have portions 11 extended from the electrode bodies 4a and 5a along the entire edges except for the sides facing the gap 13. The width of each extended portion 11 may be substantially the same as that shown in FIG. 4A.

The directions along which the lead portions 4b and 5b start extending from the electrode bodies 4a and 5a are substantially the same, and the widths of the proximal end portions 9 of the lead portions 4b and 5b are substantially equal to each other.

The electrode bodies $2a_1$ and $3a_1$ of the light-receiving electrodes 2 and 3, the lower electrode 4, and a portion of the pyroelectric film 1 which is sandwiched between the electrode bodies $2a_1$ and $3a_1$ and the electrode 4 constitute a first unit pyroelectric element Similarly, the electrode bodies $2a_2$ and $3a_2$ of the light-receiving electrodes 2 and 3, the lower electrode 5, and a portion of the pyroelectric film 1 which is sandwiched between the electrode bodies $2a_2$ and $3a_2$ and the electrode 5 constitute a second unit pyroelectric element. The first and second unit pyroelectric elements are connected in series with each other so as to have opposite polarities to constitute a dual pyroelectric element.

Figure 5B:
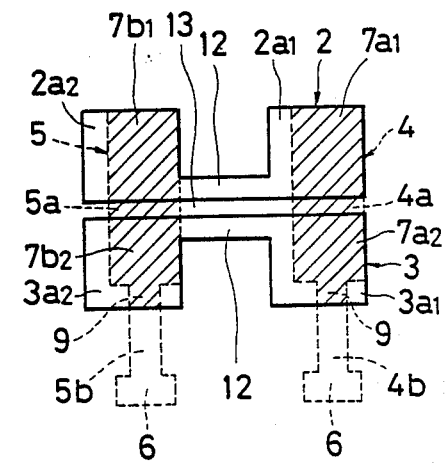
FIG. 5B is a plan view; showing the pyroelectric element shown in FIG. 5A in which light-receiving electrodes and lower electrodes are offset from each other.

FIG. 5B shows a state wherein the light-receiving electrodes 2 and 3 of the pyroelectric element shown in FIG. 5A are offset from the lower electrodes 4 and 5 by a width of the extended portion 11 in the vertical direction and the right-and-left direction.

Referring to FIG. 5B, since the proximal end portions 9 of the lead portions 4b and 5b of the electrodes 4 and 5 extend in the same direction, a state of a positional offset between the electrode bodies $2a_1$ and $3a_1$ and the electrode 4 including the lead portion 4b is similar to that between the electrode bodies $2a_2$ and $3a_2$ and the electrode 5 including the lead portion 5b. For this reason, the total effective light-receiving electrode area of the first unit pyroelectric element is substantially equal to that of the second unit pyroelectric element, as indicated by hatched portions $7a_1$ and $7a_2$ and hatched portions $7b_1$ and $7b_2$. In other words, the effective light-receiving electrode area of the first unit pyroelectric element as a sum of the hatched portions $7a_1$ and $7a_2$ is substantially equal to the effective light-receiving electrode area of the second unit pyroelectric element as a sum of the hatched portions $7b_1$ and $7b_2$ even if the electrode pattern on the upper surface of the pyroelectric film 1 is slightly shifted from that on its lower surface.

In the embodiment shown in FIGS. 5A and 5B, the two electrodes 2 and 3 are formed on the upper surface of the pyroelectric film 1. However, an electrode pattern may be formed in a portion corresponding to the gap 13 to eliminate the gap 13, thereby integrating the electrodes 2 and 3.

When a pyroelectric infrared sensor is manufactured according to conventional techniques by using the pyroelectric element shown in FIG. 4A or 5A, the light-receiving electrode areas of the unit pyroelectric elements constituting the pyroelectric element are substantially equal to each other, thereby obtaining a sensor having excellent electrical characteristics against disturbing external light.

The present invention has been described with the illustrative embodiments with reference to the accompanying drawings. However, the present invention is not limited to the particular embodiments described above. Various changes and modifications may be made by those skilled in the art within the spirit and scope of the invention defined by the appended claims. For example, the size, shape and material of the pyroelectric film 1 can be selected from any conventional size, shape and material or any other size, shape and material. Furthermore, the material and thickness of the electrodes 2 to 5 may be selected from any conventional material and thickness or any other material and thickness. The electrode patterns may also be modified in addition to ones shown in FIGS. 4A to 5B. Moreover, the pyroelectric element of the present invention need not be comprised of a pair of unit pyroelectric elements. The present invention is also applicable to a pyroelectric infrared sensor arranging three or more unit pyroelectric elements in a common package.

What is claimed is:

1. A pyroelectric element comprising:
   a pyroelectric film;
   first and second electrodes formed on one major surface of said pyroelectric film; and
   third and fourth electrodes formed on the other major surface of said pyroelectric film;
   each of said first to fourth electrodes being provided with an electrode body for defining an effective light-receiving area and a lead portion extending from said electrode body,
   said first and third electrodes and a portion of said pyroelectric film which is sandwiched between said first and third electrodes constituting a first unit pyroelectric element, and said second and fourth electrodes and a portion of said pyroelectric film which is sandwiched between said second and fourth electrodes constituting a second unit pyroelectric element,
   wherein directions and widths of proximal end portions of said lead portions extending from said electrode bodies are substantially the same relative to each other such that the effective light-receiving electrode area of said first unit pyroelectric element which is constituted by an overlapping portion between said first and third electrodes is substantially the same as that of the second unit pyroelectric element which is constituted by an overlapping portion between said second and fourth electrodes even if patterns of said first and second electrodes are offset from patterns of said third and fourth electrodes.

2. An element according to claim 1, wherein the width of said lead portion of each of said first to fourth electrodes is smaller than a width of said electrode body thereof.

3. An element according to claim 1, wherein said lead portion of each of said first to fourth electrodes comprises a proximal end portion extending from said electrode body in the same direction and a substantially L-shaped portion extending from said proximal end portion in a direction perpendicular to the same direction.

4. An element according to claim 1, wherein said distal end portions of said lead portions of said first and third electrodes oppose each other at an edge of said pyroelectric film through said pyroelectric film, and said distal end portions of said lead portions of said second and fourth electrodes oppose each other at an edge of said pyroelectric film through said pyroelectric film.

5. An element according to claim 1, wherein one of said electrode bodies of said first and second electrodes and said electrode bodies of said third and fourth electrodes has an extended portion around an overlapping portion with the other.

6. An element according to any one of claims 1, 2, 3, 4 and 7, wherein said lead portions of said first and third electrodes are electrically connected to each other, and said lead portions of said second and fourth electrodes are electrically connected to each other.

7. A pyroelectric element comprising:
   a pyroelectric film;
   first and second electrodes formed on one major surface of said pyroelectric film;
   each of said first and second electrodes being provided with an electrode body for substantially defining an effective light-receiving electrode area and a lead portion extending from said electrode body; and
   at least one third electrode formed on the other major surface of said pyroelectric film and having an electrode body opposing the electrode bodies of said first and second electrodes,
   said first and second electrodes, and at least one third electrode and portions of said pyroelectric film which are sandwiched between said at least one third electrode and said first and second electrodes constituting first and second unit pyroelectric elements,
   wherein directions and widths of proximal end portions of said lead portions extending from said electrode bodies are substantially the same relative to each other such that the effective light-receiving electrode areas constituted by overlapping portions between said at least one third electrode and said first and second electrodes are substantially equal to each other between said first and second unit pyroelectric elements even if patterns of said first and second electrodes are offset from a pattern of said at least one third electrode.

8. An element according to claim 7, wherein said at least one third electrode comprises two electrodes, one of which comprises first and second electrode bodies corresponding to one halves of said electrode bodies of said first and second electrodes and a connecting portion for electrically connecting said first and second electrode bodies, and the other of which comprises first and second electrode bodies corresponding to the other halves of said electrode bodies of said first and second electrodes, and a connecting portion for electrically connecting said first and second electrode bodies of the other of said two electrodes.

9. An element according to claim 8, wherein the width of said lead portion of each of said first and second electrodes is smaller than a width of said electrode body of each of said first and second electrodes.

10. An element according to claim 8, wherein one of said electrode bodies of said first and second electrodes and said electrode body of said at least one third electrode includes a portion extending around an overlapping portion with the other.

11. An element according to any one of claims 8, 9 and 10, wherein said lead portions of said first and second electrodes extend in a direction along which said electrode bodies extend.

12. An element according to claim 8, wherein distal end portions of said lead portions of said first and second electrodes extend to an edge of said pyroelectric film on said one major surface thereof.

* * * * *